United States Patent
Yoshida et al.

(10) Patent No.: US 11,948,995 B2
(45) Date of Patent: Apr. 2, 2024

(54) CAPACITOR AND METHOD FOR PRODUCING SAME

(71) Applicant: Panasonic Intellectual Property Management Co., Ltd., Osaka (JP)

(72) Inventors: Kazushi Yoshida, Osaka (JP); Yosuke Hagihara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/911,077

(22) PCT Filed: Jan. 22, 2021

(86) PCT No.: PCT/JP2021/002278
§ 371 (c)(1),
(2) Date: Sep. 12, 2022

(87) PCT Pub. No.: WO2021/186893
PCT Pub. Date: Sep. 23, 2021

(65) Prior Publication Data
US 2023/0178627 A1    Jun. 8, 2023

(30) Foreign Application Priority Data
Mar. 17, 2020    (JP) .................... 2020-046848

(51) Int. Cl.
*H01L 29/66*    (2006.01)
*H01L 29/06*    (2006.01)
*H01L 29/94*    (2006.01)

(52) U.S. Cl.
CPC .... *H01L 29/66181* (2013.01); *H01L 29/0665* (2013.01); *H01L 29/945* (2013.01)

(58) Field of Classification Search
CPC ... H01L 29/66181; H01L 29/945; H01G 4/30; H01G 4/33
See application file for complete search history.

(56) References Cited

U.S. PATENT DOCUMENTS

| | | | |
|---|---|---|---|
| 5,372,962 | A | 12/1994 | Hirota et al. |
| 5,739,565 | A | 4/1998 | Nakamura et al. |
| (Continued) | | | |

FOREIGN PATENT DOCUMENTS

| | | |
|---|---|---|
| JP | H05-160342 A | 6/1993 |
| JP | H06-013547 A | 1/1994 |
| (Continued) | | |

OTHER PUBLICATIONS

International Search Report dated Apr. 20, 2021 issued in International Patent Application No. PCT/JP2021/002278, with English translation.

*Primary Examiner* — Wasiul Haider
(74) *Attorney, Agent, or Firm* — Rimon P.C.

(57) ABSTRACT

A capacitor includes a silicon substrate, a conductor layer, and a dielectric layer. The silicon substrate has a principal surface including a capacitance generation region and a non-capacitance generation region. The silicon substrate includes a porous part provided in a thickness direction in the capacitance generation region. The conductor layer includes a surface layer part at least covering part of a surface of the capacitance generation region and a filling part filled in at least part of the porous part. The dielectric layer is provided between an inner surface of the porous part and the filling part. The porous part includes a macroporous part having macro pores and a nanoporous part formed in at least part of inner surfaces of the macro pores and having nano pores smaller than the macro pores.

11 Claims, 10 Drawing Sheets

(56) References Cited

U.S. PATENT DOCUMENTS

| | | |
|---|---|---|
| 2008/0291601 A1 | 11/2008 | Roozeboom et al. |
| 2014/0093782 A1 | 4/2014 | Gardner et al. |
| 2014/0153157 A1* | 6/2014 | Masuda ................. H01G 4/232 |
| | | 361/303 |
| 2020/0052064 A1* | 2/2020 | Lu ........................... H01L 28/92 |

FOREIGN PATENT DOCUMENTS

| | | |
|---|---|---|
| JP | 2001-523050 | * 11/2001 |
| JP | 2001-523050 A | 11/2001 |
| JP | 2009-515353 A | 4/2009 |
| JP | 2014-533894 A | 12/2014 |
| WO | 1999/025026 A1 | 5/1999 |
| WO | 2014/051772 A1 | 4/2014 |

* cited by examiner

US 11,948,995 B2

CAPACITOR AND METHOD FOR PRODUCING SAME

CROSS-REFERENCE OF RELATED APPLICATIONS

This application is the U.S. National Phase under 35 U.S.C. § 371 of International Patent Application No. PCT/JP2021/002278, filed on Jan. 22, 2021, which in turn claims the benefit of Japanese Patent Application No. 2020-046848, filed on Mar. 17, 2020, the entire disclosures of which Applications are incorporated by reference herein.

TECHNICAL FIELD

The present disclosure generally relates to capacitors and methods for producing the capacitors. The present disclosure specifically relates to a capacitor including a silicon substrate, a dielectric layer, and a conductor layer and a capacitor producing method for producing the capacitor.

BACKGROUND ART

Patent Literature 1 discloses an electronic device including a trench capacitor formed by alternately providing a conductor layer and a dielectric layer in a trench formed in a substrate by a method such as etching. In the electronic device of Patent Literature 1, the substrate is provided with a large number of trench capacitors to increase a capacitance value (electrostatic capacitance).

In the electronic device of Patent Literature 1, however, the electrostatic capacitance cannot satisfactorily be increased in some cases.

CITATION LIST

Patent Literature

Patent Literature 1: JP 2009-515353 A

SUMMARY OF INVENTION

An object of the present disclosure is to provide a capacitor having electrostatic capacitance which is easily increased and to provide a method for producing the capacitor.

A capacitor according to an aspect of the present disclosure includes a silicon substrate, a conductor layer, and a dielectric layer. The silicon substrate has a principal surface including a capacitance generation region and a non-capacitance generation region, and the silicon substrate includes a porous part provided in a thickness direction in the capacitance generation region. The conductor layer includes a surface layer part at least covering part of a surface of the capacitance generation region and a filling part filled in at least part of the porous part. The dielectric layer is provided between an inner surface of the porous part and the filling part. The porous part includes a macroporous part having macro pores and a nanoporous part formed in at least part of inner surfaces of the macro pores and having nano pores smaller than the macro pores.

A method for producing a capacitor according to an aspect of the present disclosure includes: providing a masking layer on a non-capacitance generation region of a silicon substrate having a principal surface including a capacitance generation region and the non-capacitance generation region; forming, by an anode oxidation process, a macroporous part in the capacitance generation region in a thickness direction defined with respect to the silicon substrate by forming macro pores in the capacitance generation region which is not covered with the masking layer; forming a nanoporous part in inner surfaces of the macro pores of the macroporous part, the nanoporous part having nano pores smaller than the macro pores; forming a dielectric layer on the inner surfaces of the macro pores and inner surfaces of the nano pores; and forming a conductor layer including a filling part filled in at least part of the macro pores and the nano pores and a surface layer part at least covering part of a surface of the capacitance generation region.

DESCRIPTION OF EMBODIMENTS

1. Embodiment (1) Overview

Figure 1:
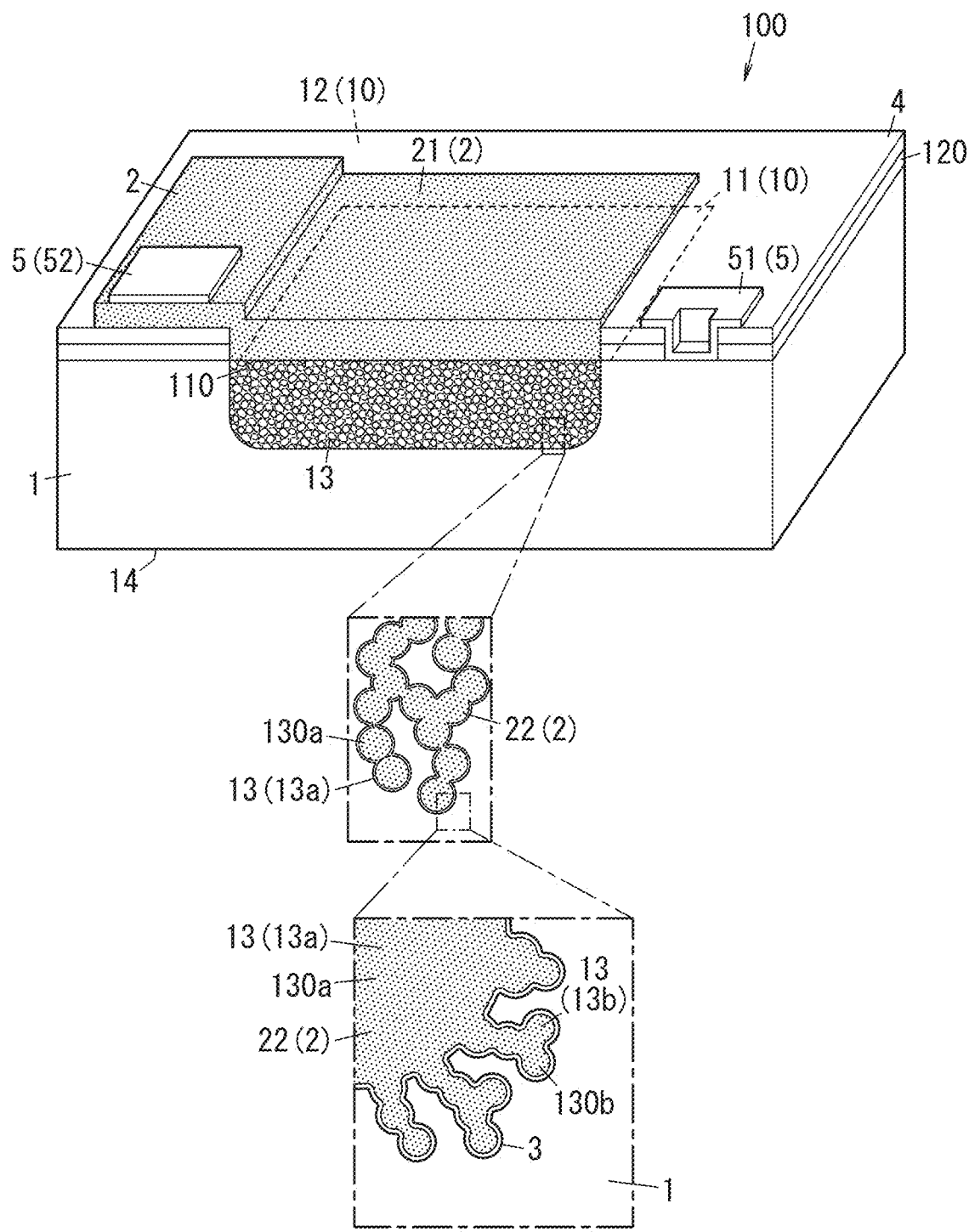
FIG. 1 is a schematic perspective view of an example of a capacitor according to an embodiment of the present disclosure.

As shown in FIGS. 1, a capacitor 100 according to the present embodiment includes a silicon substrate 1, a conductor layer 2, and a dielectric layer 3. The silicon substrate 1 has a principal surface 10 including a capacitance generation region 11 and a non-capacitance generation region 12. The silicon substrate 1 has a porous part 13 provided in a thickness direction (Z-axis direction) in the capacitance generation region 11. The conductor layer 2 has a surface layer part 21 at least covering part of a surface 110 of the capacitance generation region 11 and a filling part 22 filled in at least part of the porous part 13. The dielectric layer 3 is provided between an inner surface of the porous part 13 and the filling part 22.

In the capacitor 100 according to the present embodiment, the silicon substrate 1 may constitute a first electrode, and the conductor layer 2 may constitute a second electrode different from the first electrode. Therefore, electrostatic capacitance is produced in a part where the silicon substrate 1, the dielectric layer 3, and the conductor layer 2 are stacked on one another. In general, the electrostatic capacitance of the capacitor 100 can be increased by increasing the surface areas of electrodes (the first electrode and the second electrode). In capacitor 100 according to the present embodiment, the porous part 13 provided in the thickness direction in the capacitance generation region 11 in the principal surface 10 of the silicon substrate 1 and the filling part 22 filled in the porous part 13 easily secure the surface areas of the first electrode and the second electrode, which can increase the electrostatic capacitance of the capacitor 100.

Particularly in the present embodiment, the porous part 13 includes a macroporous part 13a and a nanoporous part 13b. The macroporous part 13a has macro pores 130a. The nanoporous part 13b is provided in at least part of inner surfaces (in the present embodiment, the entirety of inner surfaces) of the macro pores 130a. The nanoporous part 13b has nano pores 130b. The nano pores 130b are smaller than the macro pores 130a. Thus, the inner surface of the porous part 13 includes the inner surfaces of the macro pores 130a of the macroporous part 13a and inner surfaces of the nano pores 130b of the nanoporous part 13b. This can increase the surface area of the electrodes. Thus, the electrostatic capacitance of the capacitor 100 can be increased.

Moreover, in the capacitor 100 according to the present embodiment, the entirety of the principal surface 10 of the silicon substrate 1 is not made porous, but the porous part 13 is formed in the capacitance generation region 11, and therefore, the strength of the silicon substrate 1 can be suppressed from being reduced as compared to the case where the entirety of the principal surface 10 is made porous.

(2) Details
(2.1) Capacitor

The capacitor 100 according to the present embodiment will be described in further detail below with reference to the drawings. For the sake of description of the positional relationship and the like, arrows representing an X axis, a Y axis, and a Z axis of a three-dimensional orthogonal coordinate system are shown in the drawings, but these arrows are intangible. In the following description, an XY plan view means a view along the Z-axis direction. The X-axis, Y-axis, and Z-axis directions are mere examples and do not intend to limit the directions of the capacitor 100 in manufacturing and in use. Moreover, a surface (surface in the positive direction of the X axis), facing the viewer, of an object (e.g., the capacitor 100) shown in a perspective view is a cut surface.

FIG. 1 shows the capacitor 100 according to the present embodiment. The capacitor 100 includes the silicon substrate 1, the conductor layer 2, and the dielectric layer 3. The capacitor 100 may further include an inorganic insulating layer 4 and contact terminals 5.

<Silicon Substrate>

The silicon substrate 1 has a conductive property. The silicon substrate 1 constitutes an electrode (first electrode).

The silicon substrate 1 is not particularly limited as long as it is a substrate which is made of silicon and which is generally used for, for example, producing of integrated circuits. The silicon substrate 1 may be a p-type semiconductor or may be an n-type semiconductor. When the silicon substrate 1 is a p-type semiconductor, the silicon substrate 1 can be doped with a small amount of an element such as boron or aluminum (a small amount of an element such as boron or aluminum can be added to the silicon substrate 1). When the silicon substrate 1 is an n-type semiconductor, the silicon substrate 1 can be doped with a small amount of element such as phosphorus or arsenic (a small amount of element such as phosphorus or arsenic can be added to the silicon substrate 1).

The thickness of the silicon substrate 1 is not particularly limited but is preferably greater than or equal to, for example, 400 µm and less than or equal to 1000 µm.

In the present embodiment, the silicon substrate 1 has a rectangular shape in the XY plan view, but the shape of the silicon substrate 1 in the XY plan view is not limited to this example. For example, the silicon substrate 1 may have a triangular shape in the XY plan view, may have a polygonal shape having more vertices than a triangular shape, or may have a circular shape.

As shown in FIG. 1, the silicon substrate 1 has the principal surface 10 (hereinafter also referred to as a first principal surface 10) and a second principal surface 14 located on an opposite side of the principal surface 10. The first principal surface 10 is a surface of the silicon substrate 1 in the positive direction of the Z axis. The second principal surface 14 is a surface of the silicon substrate 1 in the negative direction of the Z axis.

In the silicon substrate 1, the first principal surface 10 includes the capacitance generation region 11 and the non-capacitance generation region 12. The capacitance generation region 11 is a region formed in the capacitor 100 aimed to generate electrostatic capacitance. The non-capacitance generation region 12 is a region of the first principal surface 10 except for the capacitance generation region 11. Thus, the non-capacitance generation region 12 is not a region in which no electrostatic capacitance is generated. In the non-capacitance generation region 12, electrostatic capacitance may be generated. Moreover, in the present embodiment, the non-capacitance generation region 12 has an oxidized surface. That is, the surface of the non-capacitance generation region 12 is made of oxide of the silicon substrate 1 and is made of, for example, oxidized silicon ($SiO_2$) Thus, the capacitor 100 according to the present embodiment includes an oxidized coating 120 made of oxidized silicon on the non-capacitance generation region 12.

The size of the capacitance generation region 11 depends on the size of the first principal surface 10 but is preferably greater than or equal to, for example, $4 \times 10^2$ µm$^2$ and is preferably less than or equal to 1 mm$^2$.

In the present embodiment, the porous part 13 is provided in the thickness direction (Z axis direction) in the capacitance generation region 11 of the first principal surface 10 (see FIG. 1). The porous part 13 includes the macroporous part 13a and the nanoporous part 13b.

The macroporous part 13a has the plurality of (an infinite number of) macro pores 130a. The macro pores 130a are substantially vertically elongated pores (see FIGS. 7A to 9). The macro pores 130a extend from a plurality of locations in the capacitance generation region 11 along a direction transverse to the principal surface 10 (in the present embodiment, a thickness direction defined with respect to the silicon substrate 1). The macro pores 130a are formed from the capacitance generation region 11 of the first principal surface 10 toward the second principal surface 14. Thus, the plurality of macro pores 130a extend along the thickness direction defined with respect to the silicon substrate 1. The plurality of macro pores 130a are aligned substantially parallel to each other. The macro pores 130a are non-through holes. The macro pores 130a are open in the capacitance generation region 11 of the first principal surface 10. As shown in FIG. 1, the macro pores 130a may be branched. The macro pores 130a increase in their surface areas by being branched.

The average value of the lengths (lengths along the thickness direction defined with respect to the silicon substrate 1) of the macro pores 130a is not particularly limited but is preferably, for example, greater than or equal to 30 μm and less than or equal to 50 μm. The average value of pore diameters (pore diameters in a surface orthogonal to the thickness direction defined with respect to the silicon substrate 1) of the macro pores 130a is not particularly limited but is, for example, greater than or equal to 100 nm and less than or equal to 5 μm. As described above, the macroporous part 13a has a plurality of micrometer-order macro pores 130a.

On the other hand, the nanoporous part 13b is provided in at least part of the inner surfaces of the macro pores 130a. In the present embodiment, as shown in FIG. 7D, the nanoporous part 13b is provided in the entire inner surfaces of the macro pores 130a. Note that the nanoporous part 13b may be formed only in part of the inner surfaces of the macro pores 130a (e.g., a bottom surface in the macro pore 130a).

Figure 8:
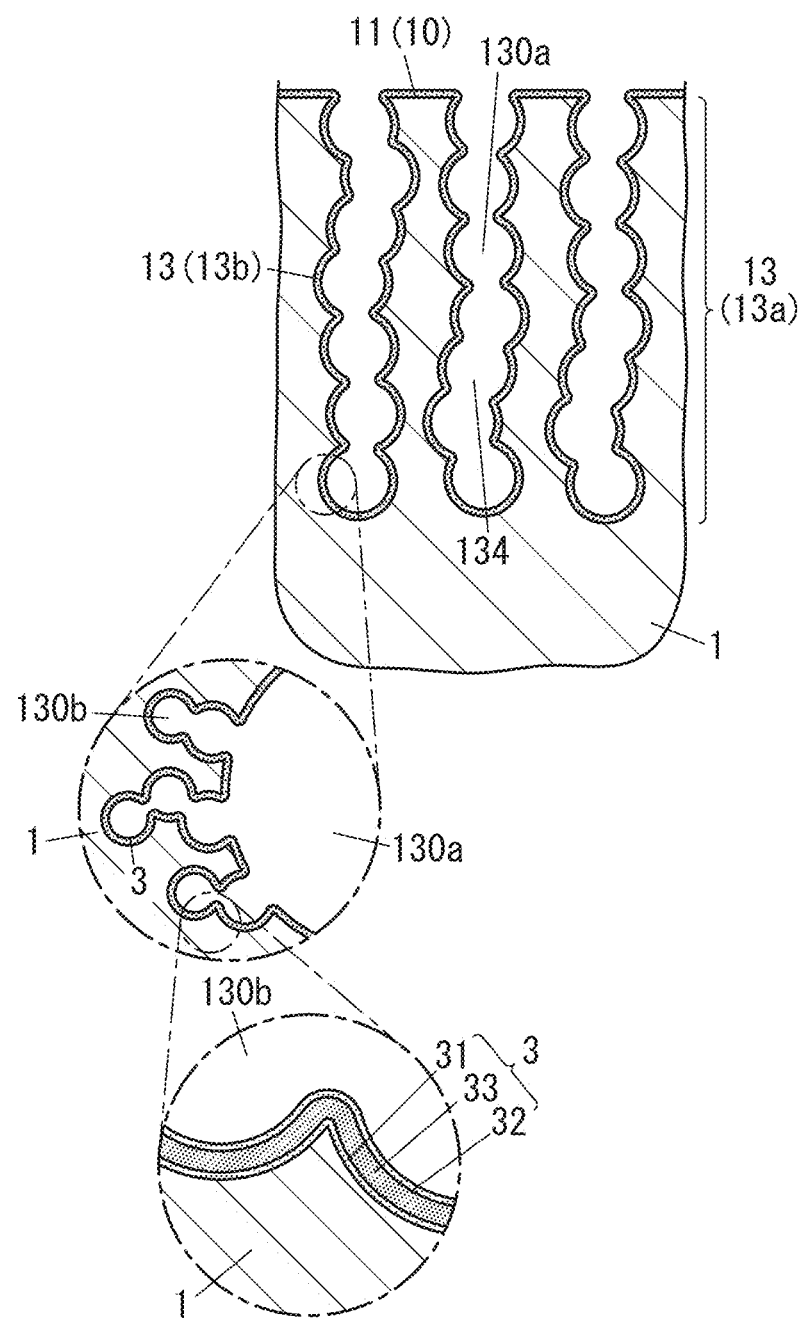
FIG. 8 is an enlarged view of the main part of the silicon substrate after dielectric layer formation.

As shown in FIGS. 1 and 8, the nanoporous part 13b has the plurality of (an infinite number of) nano pores 130b. The nano pores 130b are smaller than the macro pores 130a. Each nano pore 130b is constituted by a plurality of fine pores (see FIGS. 1 and 8) continuous from the inner surface of the macro pore 130a. The nano pores 130b are randomly oriented. As shown in FIG. 1, the nano pores 130b may be branched. The nano pores 130b increase in their surface areas by being branched. When roots of a plant are taken as an example, the macro pores 130a can correspond to main roots each extending in substantially one direction, and the nano pores 130b can correspond to lateral roots branched off from the main roots. The average value of pore diameters of the nano pores 130b is not particularly limited but is preferably greater than or equal to 30 nm and less than or equal to 500 nm. Such a pore diameter allows both the dielectric layer 3 and the conductor layer 2 (filling part 22) to enter the nano pores 130b. The pore diameter of each nano pore 130b is measurable by a publicly known means such as SEM image observation. As described above, the nanoporous part 13b has a plurality of nanometer-order nano pores 130b.

Thus, the inner surface of the porous part 13 includes the inner surfaces of the macro pores 130a of the macroporous part 13a and the inner surfaces of the nano pores 130b of the nanoporous part 13b. This can increase the surface area of the inner surface of the porous part 13. Thus, the electrostatic capacitance of the capacitor 100 can be increased.

Figure 2:
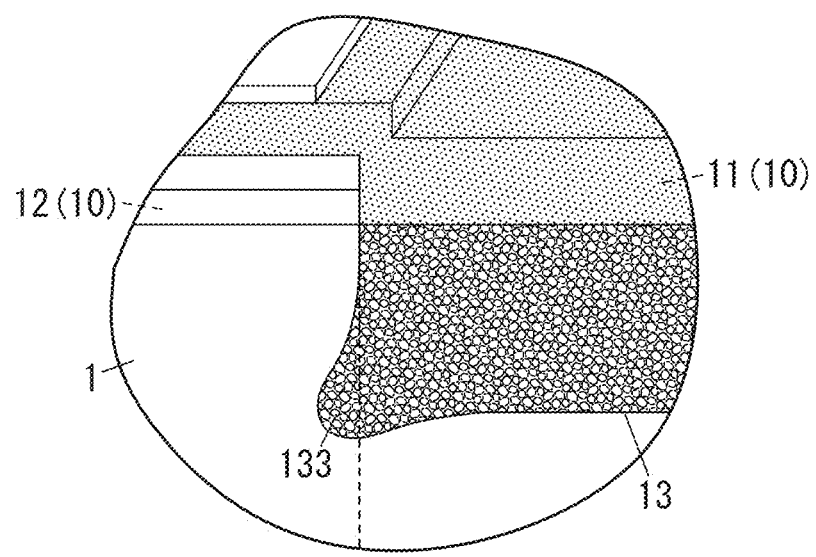
FIG. 2 is an enlarged view of a main part of the capacitor of FIG. 1.

The porous part 13 may be provided to the entirety of the capacitance generation region 11 or may be provided to part of the capacitance generation region 11. Moreover, the non-capacitance generation region 12 has almost no openings of the macro pores 130a, but part of the macro pores 130a may be provided below the non-capacitance generation region 12 (negative direction of the Z axis). That is, part of the macro pores 130a may be provided at a portion underlying the non-capacitance generation region 12 of the silicon substrate 1 in the thickness direction. For example, as shown in FIG. 2, the porous part 13 has a corner 133 which extends from a portion underlying the capacitance generation region 11 of the silicon substrate 1 in the thickness direction into the portion underlying the non-capacitance generation region 12 of the silicon substrate 1 in the thickness direction. That is, the corner 133 may be provided to lie under the non-capacitance generation region 12, and the corner 133 may be overlapped by the non-capacitance generation region 12 in the thickness direction. Moreover, since the corner 133 is part of the porous part 13, in the present embodiment, the part of the porous part 13 may extend into part of the silicon substrate 1 underlying the non-capacitance generation region 12 in the thickness direction. That is, the part of the porous part 13 may underlie the non-capacitance generation region 12 of the silicon substrate 1 in the thickness direction. Moreover, the part of the porous part 13 may exist in the portion underlying the non-capacitance generation region 12 of the silicon substrate 1 in the thickness direction.

The thickness of the porous part 13 (the distance from the surface 110 of the capacitance generation region 11 to a bottom of the porous part 13) is preferably greater than or equal to 30 μm. In this case, the surface area of the inner surface of the porous part 13 is easily secured, and the electrostatic capacitance of the capacitor 100 is easily increased. Note that the thickness of the porous part 13 means the average value of distances from the first principal surface 10 to bottoms of the macro pores 130a in a direction along the thickness direction defined with respect to the silicon substrate 1. Moreover, the thickness of the porous part 13 is preferably, for example, less than or equal to 50 μm. In this case, the porous part 13 can be suppressed from being damaged when the conductor layer 2 (the filling part 22) is formed in the porous part 13. For example, the amount of time for performing an anode oxidation process in a porous part forming step described later may be adjusted to adjust the thickness of the porous part 13.

Moreover, part of the macro pores 130a in the porous part 13 may extend through the second principal surface 14. That is, part of the porous part 13 may be exposed at the second principal surface 14 located on an opposite side of the silicon substrate 1 from the principal surface 10. In this case, a maximum value of the thickness of the porous part 13 is equal to the thickness of the silicon substrate 1.

In the capacitor 100 shown in FIG. 1, the porous part 13 is provided to the entirety of the capacitance generation region 11. Moreover, the porous part 13 has the plurality of macro pores 130a. The average value of diameters of the macro pores 130a is preferably greater than or equal to 100 nm. In this case, the strength of the porous part 13 is easily secured, and the porous part 13 can be suppressed from being damaged when the macro pores 130a of the porous part 13 is filled with the conductor layer 2 (the filling part 22) described later. Moreover, the average value of diameters of the macro pores 130a is preferably less than or equal to 5 μm. In this case, the surface areas of the inner surfaces of the macro pores 130a are easily increased, and the electrostatic capacitance of the capacitor 100 is easily increased. Moreover, the average value of diameters of the macro pores 130a is particularly preferably greater than or equal to 1 μm and less than or equal to 4 μm. In this case, both securing of the electrostatic capacitance of the capacitor 100 and the strength of the porous part 13 are achievable.

In the present embodiment, the surface enlargement ratio of the porous part 13 is preferably greater than or equal to 200. The surface enlargement ratio of the porous part 13 means the ratio of the actual surface area of the porous part 13 (the surface area of the inner surface of the porous part 13) to the area of the surface of the porous part 13 viewed (the area of the capacitance generation region 11). That is, the porous part 13 preferably has a surface area 200 or more times the area of the capacitance generation region 11. In this case, the electrostatic capacitance of the capacitor 100 can be increased. The surface enlargement ratio of the porous part 13 is preferably less than or equal to 5000. That is, the porous part 13 preferably has a surface area 5000 or less times the area of the capacitance generation region 11. In this case, the strength of the porous part 13 is easily secured, and the porous part 13 can be suppressed from being damaged when the macro pores 130a of the porous part 13 is filled with the conductor layer 2 (the filling part 22) described later. In order to achieve both the electrostatic capacitance of the capacitor 100 and the strength of the porous part 13, the surface enlargement ratio of the porous part 13 is particularly preferably greater than or equal to 500 and less than or equal to 2000. That is, the porous part 13 particularly preferably has a surface area greater than or equal to 500 times and less than or equal to 2000 times the area of the capacitance generation region 11.

<Conductor Layer>

The conductor layer 2 has a conductive property. The conductor layer 2 constitutes an electrode (second electrode). The conductor layer 2 constitutes the second electrode different from the first electrode.

The conductor layer 2 is not particularly limited as long as it is made of a conductive material. Examples of the conductive material suitable for producing the capacitor 100 according to the present embodiment include polysilicon, platinum, and ruthenium. Thus, the conductor layer 2 preferably includes at least one kind of element selected from the group consisting of polysilicon, platinum, and ruthenium. These materials are materials having a low resistance value and can thus improve the conductive property of the conductor layer 2. The conductor layer 2 particularly preferably contains polysilicon. In this case, the equivalent series resistance (ESR) of the capacitor 100 can be reduced. Moreover, including polysilicon into the conductor layer 2 can reduce the linear expansivity difference between the silicon substrate 1 and the conductor layer 2 and suppress stress from being caused due to the linear expansivity difference even when the temperature of the capacitor 100 increases. Moreover, when the conductor layer 2 includes polysilicon, the polysilicon is preferably doped with an impurity (a dopant). In this case, the band gap of the polysilicon can be reduced, which can improve the conductive property of the conductor layer 2. Examples of the dopant include boron (B), phosphorus (P), and arsenic (As).

The conductor layer 2 includes the surface layer part 21 and the filling part 22 (see FIG. 1).

In the capacitance generation region 11, the surface layer part 21 covers at least part of a surface (surface in the positive direction of the Z axis) of the porous part 13. In other words, the surface layer part 21 is provided on the openings of the macro pores 130a of the porous part 13 and closes these openings. Since the surface of the porous part 13 is the surface 110 of the capacitance generation region 11, the surface layer part 21 covers at least part of the surface 110 of the capacitance generation region 11. The surface layer part 21 may cover the entirety of the surface 110 of the capacitance generation region 11. The surface layer part 21 does not have to cover the entirety of the surface 110 of the capacitance generation region 11 but may cover part of the surface 110 of the capacitance generation region 11. The thickness of the surface layer part 21 is preferably greater than or equal to 1 μm. In this case, the strength of the surface layer part 21 can be improved, and thereby, the strength of the filling part 22 connected to the surface layer part 21 can also be improved, and the strength of the conductor layer 2 can thus be improved. Moreover, the thickness of the surface layer part 21 is preferably less than or equal to 200 μm. In this case, the equivalent series resistance (ESR) of the capacitor 100 can be suppressed from increasing.

The filling part 22 is filled in at least part of the interior of the porous part 13. In the present embodiment, the filling part 22 is filled in the entirety of the interior of the porous part 13. The interior of the porous part 13 includes the interior of the macroporous part 13a and the interior of the nanoporous part 13b. The interior of the macroporous part 13a includes the interiors of the macro pores 130a. The interior of the nanoporous part 13b includes the interiors of the nano pores 130b. In the present embodiment, the filling part 22 is filled in the entirety of the interiors of the macro pores 130a and the nano pores 130b (see FIG. 1). Note that the porous part 13 does not have to be fully filled with the filling part 22 but may have a portion which is not filled with the filling part 22.

In the capacitor 100 according to the present embodiment, the filling part 22 and the surface layer part 21 are continuous with each other. Specifically, the filling part 22 and the surface layer part 21 are preferably continuous with each other at openings of the macro pores 130a of the macroporous part 13a included in the porous part 13.

In the capacitor 100 according to the present embodiment, the conductor layer 2 is also provided on part of the non-capacitance generation region 12. Between the conductor layer 2 on the non-capacitance generation region 12 and the silicon substrate 1, an insulating coating is provided, which can generate electrostatic capacitance also in the non-capacitance generation region 12. Note that in the present specification, the insulation property means an electrically insulating property unless otherwise specified. Moreover, in the capacitor 100 according to the present embodiment, the conductor layer 2 on the non-capacitance generation region 12 and the surface layer part 21 are continuous with each other. In the present embodiment, the filling part 22 and the surface layer part 21 are continuous with each other, and therefore, the conductor layer 2 on the non-capacitance generation region 12, the surface layer part 21, and the filling part 22 are continuous with one another. The conductor layer 2 provided on the non-capacitance generation region 12 may be, but does not have to be, flush with the surface layer part 21. In the capacitor 100 according to the present embodiment, the conductor layer 2 on the non-capacitance generation region 12 and the surface layer part 21 are not flush with each other, a level difference is provided at the border therebetween, and the surface layer part 21 is lower than the conductor layer 2 on the non-capacitance generation region 12. The dimension of the level difference between the surface layer part 21 and the conductor layer 2 on the non-capacitance generation region 12 is preferably, for example, greater than or equal to 0.2 μm and less than or equal to 2.0 μm.

<Dielectric Layer>

The dielectric layer 3 is an insulating coating. In the capacitor 100 according to the present embodiment, the dielectric layer 3 is provided between the inner surface of the porous part 13 and the filling part 22 as shown in FIG. 1. As described above, the inner surface of the porous part 13 includes the interior of the macroporous part 13a and the interior of the nanoporous part 13b. In the present embodiment, the dielectric layer 3 is extended into the macro pores 130a. Moreover, the dielectric layer 3 is also extended into the nano pores 130b (see FIG. 1). The filling part 22 is part of the conductor layer 2. The filling part 22 is filled in the macro pores 130a. The filling part 22 is filled also in the nano pores 130b smaller than the macro pores 130a. That is, the conductor layer 2 (filling part 22) is also extended into the nano pores 130b (see FIG. 1).

The material for the dielectric layer 3 is not particularly limited as long as it has an insulation property. The dielectric layer 3 is preferably made of oxidized silicon ($SiO_2$) In this case, the dielectric layer 3 can be formed by oxidizing the inner surface of the porous part 13 which is part of the silicon substrate 1. In addition, the dielectric layer 3 may be an Oxide/Nitride/Oxide film (ONO film). As shown in FIG. 8, the ONO film includes a first silicon oxide film 31 ($SiO_2$), a nitride film 33 ($Si_3N_4$), and a second silicon oxide film 32 ($SiO_2$). The first silicon oxide film 31, the nitride film 33, and the second silicon oxide film 32 are stacked in this order to form the ONO film. Other examples of the material for the dielectric layer 3 include titanium oxide, oxidation zirconium, oxidation hafnium, oxidation vanadium, oxidation tungsten, oxidation niobium, oxidation tantalum, and aluminum oxide.

The thickness of the dielectric layer 3 is preferably, for example, greater than or equal to 10 nm. In this case, the inner surfaces of the macro pores 130a and the nano pores 130b of the porous part 13 are easily insulated from the filling part 22. Moreover, the thickness of the dielectric layer 3 is preferably, for example, less than or equal to 500 nm. In this case, the macro pores 130a and the nano pores 130b can be easily filled with the filling part 22, the strength of the filling part 22 is easily improved, and the strength of the conductor layer 2 is also easily improved. Further reducing the distance between the first electrode and the second electrode can also increase the electrostatic capacitance of the capacitor 100.

<Inorganic Insulating Layer>

The capacitor 100 according to the present embodiment further includes the inorganic insulating layer 4. The inorganic insulating layer 4 is an insulating coating made of an inorganic material. The inorganic insulating layer 4 is used to suppress a short circuit (a short) from being formed between the silicon substrate 1 constituting the first electrode and the conductor layer 2 constituting the second electrode.

In the capacitor 100 according to the present embodiment, the inorganic insulating layer 4 is provided on the non-capacitance generation region 12. Thus, the silicon substrate 1 and the conductor layer 2 are easily insulated from each other in the non-capacitance generation region 12. The inorganic insulating layer 4 may be provided on the entire surface of the non-capacitance generation region 12 or does not have to be provided on the entire surface of the non-capacitance generation region 12. In the capacitor 100 according to the present embodiment, the inorganic insulating layer 4 is provided on the entire surface of the non-capacitance generation region 12. The thickness of the inorganic insulating layer 4 is preferably, for example, greater than or equal to 0.5 μm. In this case, the inorganic insulating layer 4 can be suppressed from being damaged in a later-described step of forming the porous part 13. Moreover, an upper limit value of the thickness of the inorganic insulating layer 4 is not particularly limited but is preferably, for example, less than or equal to 2.0 μm.

The material for the inorganic insulating layer 4 is not particularly limited as long as the inorganic insulating layer 4 is made of an inorganic material having an insulation property. In the present embodiment, the inorganic insulating layer 4 preferably includes at least silicon nitride ($Si_3N_4$). In this case, the insulation property of the inorganic insulating layer 4 can satisfactorily be ensured. Moreover, the inorganic insulating layer 4 can be suppressed from being damaged also in the later-described step of forming the porous part 13. The difference from the silicon substrate 1 in terms of the linear expansivity can be further reduced, and therefore, the capacitor 100 can also be suppressed from being warped. Naturally, the inorganic insulating layer 4 may contain a component other than silicon nitride.

In the capacitor 100 according to the present embodiment, the inorganic insulating layer 4 is provided between the conductor layer 2 above the non-capacitance generation region 12 and the silicon substrate 1. That is, the silicon substrate 1 (the non-capacitance generation region 12), the inorganic insulating layer 4, and the conductor layer 2 are stacked in this order. Thus, in the capacitor 100 according to the present embodiment, electrostatic capacitance can be generated at a portion of the non-capacitance generation region 12 provided with the conductor layer 2.

<Contact Terminal>

The capacitor 100 according to the present embodiment further includes the contact terminals 5. The contact terminals 5 can be used, for example, to connect a substrate and the capacitor 100 to each other when the capacitor 100 is mounted on the substrate. The material for the contact terminals 5 is not particularly limited as long as it is a conductive material for contact points and the like of electronic components. Examples of the material for the contact terminals 5 include gold, silver, copper, platinum, and ruthenium. In the present embodiment, the contact terminals 5 are preferably made of titanium and preferably are plated with gold. In this case, both the strength and the conductive property of the contact terminals 5 are achievable. The shape of the contact terminals 5 in XY plan view is not particularly limited.

The contact terminals 5 include a first contact terminal 51 and a second contact terminal 52. The first contact terminal 51 and the second contact terminal 52 are both provided above the silicon substrate 1 (in the positive direction of the Z axis) and are exposed outside above the silicon substrate 1.

The first contact terminal 51 is in ohmic contact with the silicon substrate 1, and thereby, the first contact terminal 51 is electrically connected with the silicon substrate 1 constituting the first electrode. Specifically, the first contact terminal 51 is provided in a through hole formed in the inorganic insulating layer 4, and a portion of the first contact terminal 51 is provided on the inorganic insulating layer 4. In the capacitor 100 according to the present embodiment, a portion of the first contact terminal 51 provided in the through hole formed in the inorganic insulating layer 4 is more depressed than the portion of the first contact terminal 51 provided on the inorganic insulating layer 4. Moreover, in the capacitor 100 according to the present embodiment, an oxidized coating 120 made of oxidized silicon is provided on the surface of the silicon substrate 1, and the first contact terminal 51 penetrates through the oxidized coating 120 to come into ohmic contact with the silicon substrate 1. Thus, the first contact terminal 51 and the silicon substrate 1 can be electrically connected to each other. The thickness of the portion of the first contact terminal 51 provided on the inorganic insulating layer 4 is preferably greater than or equal to 200 nm and less than or equal to 500 nm to secure strength and connection reliability.

The second contact terminal 52 is in ohmic contact with the conductor layer 2, and thereby, the second contact terminal 52 is electrically connected to the conductor layer 2 constituting the second electrode. Specifically, the second contact terminal 52 is provided on the conductor layer 2 provided above the non-capacitance generation region 12. Thus, the second contact terminal 52 is in ohmic contact with the conductor layer 2 on the non-capacitance generation region 12, and thereby, the second contact terminal 52 is electrically connected to the conductor layer 2 on the non-capacitance generation region 12. Moreover, in the capacitor 100 according to the present embodiment, the conductor layer 2 above the non-capacitance generation region 12 and the surface layer part 21 are continuous with each other, and the surface layer part 21 and the filling part 22 are continuous with each other. Thus, in the capacitor 100 according to the present embodiment, the second contact terminal 52 is electrically connected to the surface layer part 21, and the second contact terminal 52 is electrically connected to the filling part 22. The thickness of the second contact terminal 52 is preferably greater than or equal to 200 nm and less than or equal to 500 nm in order to secure strength and connection reliability.

The difference in height between the first contact terminal 51 and the second contact terminal 52 is preferably less than or equal to 2.0 µm. In this case, the first contact terminal 51 and the second contact terminal 52 are easily provided on a substrate or the like.

(2.2) Method for Producing Capacitor

The method for producing the capacitor 100 according to the present embodiment will be described in further detail below with reference to the drawings.

The method for producing the capacitor 100 according to the present embodiment includes a masking step, a porous part forming step, a dielectric layer forming step, and a conductor layer forming step. These steps will be described with reference to FIGS. 3A to 3D, FIGS. 4A to 4C, FIG. 5, and FIGS. 6A to 6E.

<Masking Step>

The masking step includes providing a masking layer 40 on the non-capacitance generation region 12 of the silicon substrate 1 having the principal surface 10 including the capacitance generation region 11 and the non-capacitance generation region 12. Specifically, the masking layer 40 is formed by the following method.

Figure 3A:
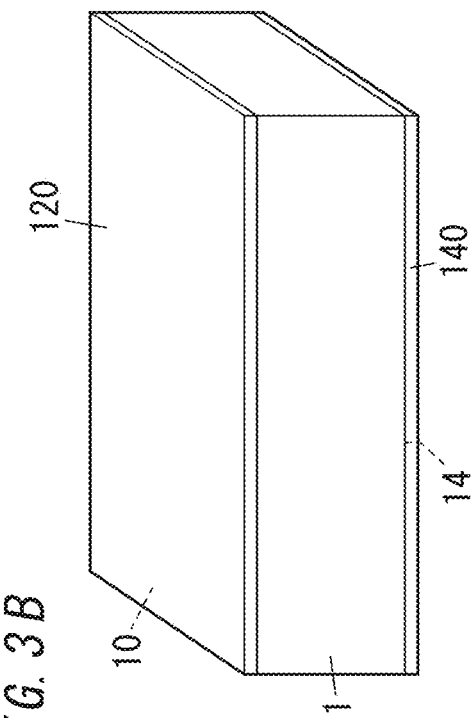
FIGS. 3A to 3D are schematic perspective views of an example of a method for producing the capacitor according to the embodiment of the present disclosure.

First of all, the silicon substrate 1 is prepared as shown in FIG. 3A.

Figure 3B:
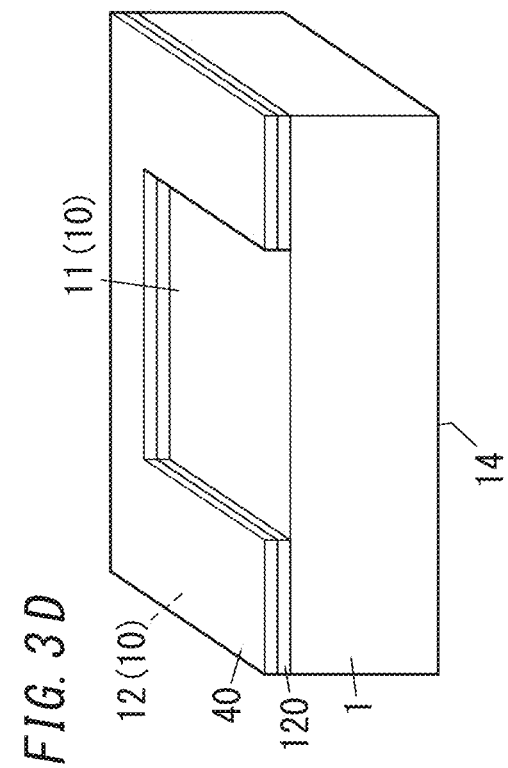

Then, the silicon substrate 1 is subjected to a thermal oxidation process as shown in FIG. 3B. This forms the oxidized coating 120 made of oxidized silicon on the first principal surface 10 of the silicon substrate 1 and an oxidized coating 140 made of oxidized silicon on the second principal surface 14, which can secure insulation properties of the first principal surface 10 and the second principal surface 14 of the silicon substrate 1. The condition of the thermal oxidation process is preferably, for example, that the heating temperature is higher than or equal to 1000° C. and lower than or equal to 1200° C. in an oxygen atmosphere. In the present embodiment, the oxidized coating 120 is formed on the entirety of the first principal surface 10. The oxidized coating 120 can secure the insulation property of the first principal surface 10 of the silicon substrate 1.

Figure 3C:
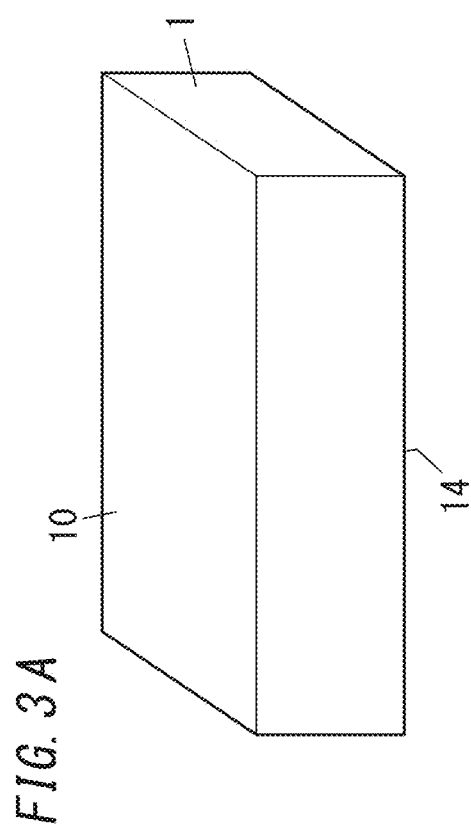

Next, as shown in FIG. 3C, the masking layer 40 is formed on the oxidized coating 120 provided on the first principal surface 10. In the present embodiment, the masking layer 40 is formed on the entire surface of the oxidized coating 120. The masking layer 40 preferably adopts a coating which is less likely to be deteriorated and changed in property by the anode oxidation process described later. The masking layer 40 is preferably, for example, a coating of metal (e.g., chrome and gold), a coating made of an organic resin used as a resist material adopted to produce a printed wiring board or the like, or a coating made of silicon nitride. In the present embodiment, the masking layer 40 is particularly preferably a coating made of silicon nitride. In this case, the linear expansivity difference between the silicon substrate 1 and the masking layer 40 can be reduced in the case where a masking layer including silicon nitride remains in the capacitor 100, and thereby, the capacitor 100 can be suppressed from warping. In the following description, an example in which the masking layer 40 is made of silicon nitride will be described. When the masking layer 40 is made of silicon nitride, the masking layer 40 may be produced by, for example, chemical vapor deposition (CVD) or plasma CVD.

Figure 3D:
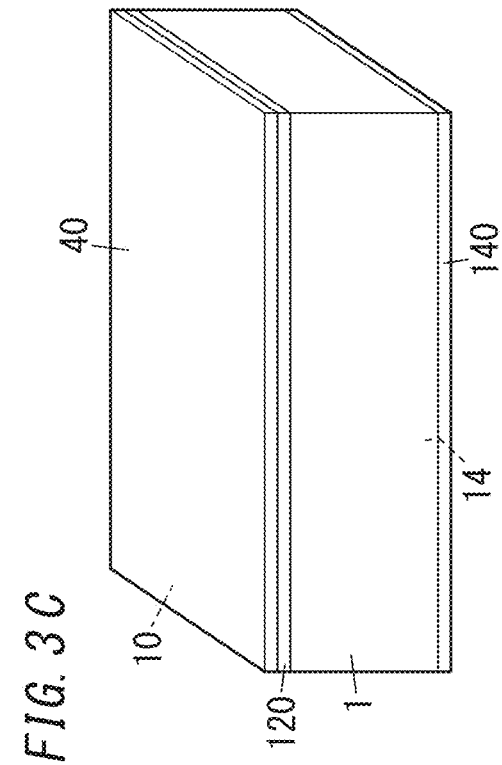

Next, as shown in FIG. 3D, a portion of the masking layer 40 which overlaps the capacitance generation region 11 is removed (patterned) by a publicly known method. At this time, a portion of the oxidized coating 120 which overlaps the capacitance generation region 11 is also removed. This can leave the masking layer 40 on the non-capacitance generation region 12. Moreover, the capacitance generation region 11 of the first principal surface 10 can be exposed. Moreover, in the non-capacitance generation region 12, the oxidized coating 120 and the masking layer 40 are stacked in this order. A method for patterning the masking layer 40 is not particularly limited, but, for example, plasma etching may be adopted.

Moreover, in the masking step, the oxidized coating 140 formed on the second principal surface 14 is preferably removed (see FIG. 3D).

Moreover, in the above-described method, the portion overlapping the capacitance generation region 11 is removed from the masking layer 40 formed on the entirety of the first principal surface 10 to leave the masking layer 40 on the non-capacitance generation region 12, but this should not be construed as limiting. For example, the masking layer 40 may directly be formed only on the non-capacitance generation region 12. In this case, the portion of the oxidized coating 120 overlapping the capacitance generation region 11 has to be removed.

<Porous Part Forming Step>

The porous part forming step includes, by performing the anode oxidation process at least twice, forming the porous part 13 in the capacitance generation region 11, which is not covered with the masking layer 40, in the thickness direction defined with respect to the silicon substrate 1.

First of all, the porous part forming step will be briefly described. The porous part forming step includes a macroporous part forming step (see FIGS. 7A to 7C) and a nanoporous part forming step (FIG. 7D). Note that FIGS. 7A to 7D are schematic views for facilitating the understanding of the description.

The macroporous part forming step includes performing an anode oxidation process for a first time (first anode oxidation process) on the capacitance generation region 11 of the silicon substrate 1. The macroporous part 13a is thus formed. However, fine nanoporous parts 13c may be clogged in the macro pores 130a (see FIGS. 7A and 9A). Here, the fine nanoporous parts 13c have a plurality of (infinite number of) fine nano pores 130c. The fine nano pores 130c are smaller than the nano pores 130b. Thus, the fine nano pores 130c hardly allow the dielectric layer 3 and the conductor layer 2 to enter therein. Therefore, the fine nanoporous parts 13c are removed from the macro pores 130a. In the present embodiment, to facilitate removal of the fine nanoporous parts 13c, the fine nanoporous parts 13c are once changed into oxidized products 15 (see FIG. 7B). Then, etching or the like removes the oxidized products 15 from the macro pores 130a (see FIG. 7C).

In the nanoporous part forming step, the nanoporous part 13b is then formed in the inner surface of each of the macro pores 130a by performing the anode oxidation process for a second time (second anode oxidation process). Conditions of the second anode oxidation process may be made different from conditions of the first anode oxidation process. For example, the conditions of the second anode oxidation process are set such that the nano pores 130b greater than the fine nano pores 130c and smaller than the macro pores 130a are formed. Thus, a hollow part 134 remains as shown in FIG. 7D, and therefore, the dielectric layer 3 and the conductor layer 2 easily enter the hollow part 134 (the macro pores 130a and the nano pores 130b). The porous part forming step will be described below in further detail.

Figure 4A:
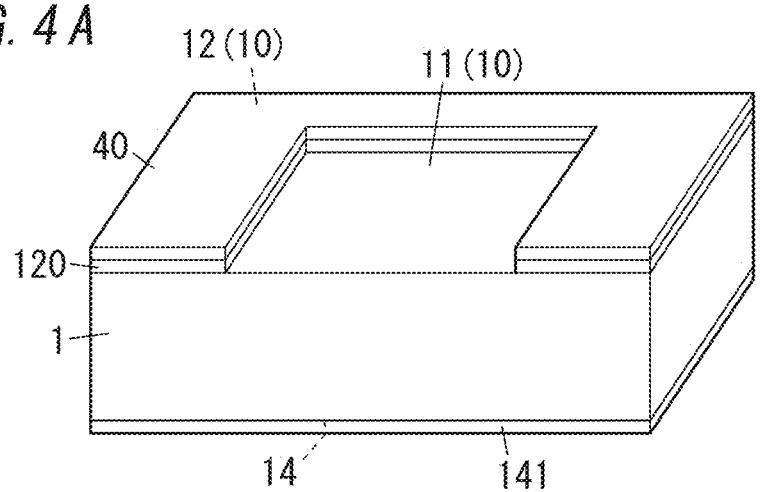
FIGS. 4A to 4C are schematic perspective views of the example of the method for producing the capacitor according to the embodiment of the present disclosure.

First of all, a back surface electrode 141 is formed on the second principal surface 14 as shown in FIG. 4A. The back surface electrode 141 is an electrode used when the silicon substrate 1 is subjected to the anode oxidation process, and the back surface electrode 141 is an electrically conductive coating. Thus, the silicon substrate 1 and the back surface electrode 141 are preferably in ohmic contact with each other, and thereby, the silicon substrate 1 and the back surface electrode 141 are preferably electrically connected to each other. In the present embodiment, the back surface electrode 141 is preferably formed on the entirety of the second principal surface 14.

Figure 4B:
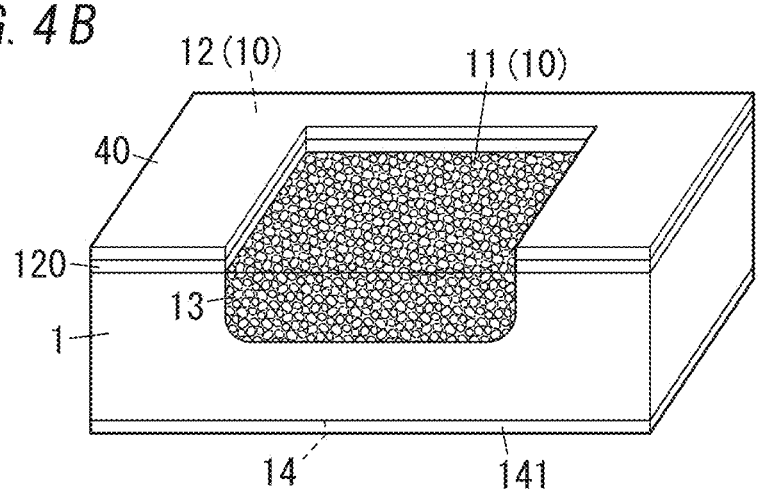

Then, as shown in FIG. 4B, the silicon substrate 1 is subjected to the first anode oxidation process. Specifically, the silicon substrate 1 is placed in mixed liquid, and a current is caused to flow between the back surface electrode 141 provided on the second principal surface 14 and the mixed liquid including an acid. This forms the macroporous part 13a in the capacitance generation region 11 which is exposed. However, the fine nanoporous parts 13c can be formed in the macro pores 130a of the macroporous part 13a (see FIG. 7A). The overall shape of each fine nanoporous part 13c is substantially similar to the shape of a corresponding one of the macro pores 130a which is filled with the fine nanoporous part 13c. In contrast, no macroporous part 13a is formed in the non-capacitance generation region 12 covered with the masking layer 40. In the present embodiment, the mixed liquid used in the anode oxidation process is preferably mixed liquid of hydrofluoric acid (HF) and ethanol.

Next, a step of removing at least part of the fine nanoporous parts 13c present in the macro pores 130a is further performed. In FIG. 7C, the entirety of the fine nanoporous parts 13c present in the macro pores 130a is removed. For example, part of the fine nanoporous parts 13c may remain on bottom parts in the macro pores 130a.

Here, a means for removing the fine nanoporous parts 13c from the macro pores 130a is not particularly limited. A first removable means and a second removable means are described as specific examples below.

The first removable means is a means of utilizing a difference in reaction speed with an etching solution (an etchant). The surface area of the macroporous part 13a is different from the total surface area of the fine nanoporous parts 13c. The total surface area of the fine nanoporous parts 13c is greater than that of the macroporous part 13a. Thus, the fine nanoporous parts 13c are more easily removed by etching solution than the macroporous part 13a. The etching solution is not particularly limited, but examples of the etching solution include a tetramethylammonium hydroxide (TMAH) aqueous solution, hydrofluoric acid (a mixture solution of hydrofluoric acid and nitric acid), and a potassium hydroxide (KOH) aqueous solution.

Figure 9A:
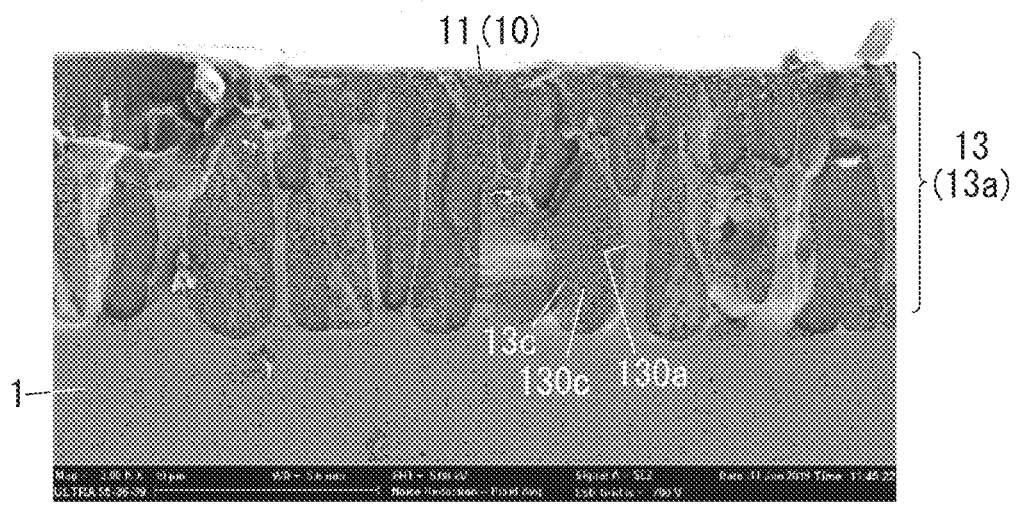
FIG. 9A is a photograph (magnification: 3000) obtained by capturing an image of the main part of the silicon substrate by a scanning electron microscope (SEM) after the anode oxidation process.
Figure 9B:
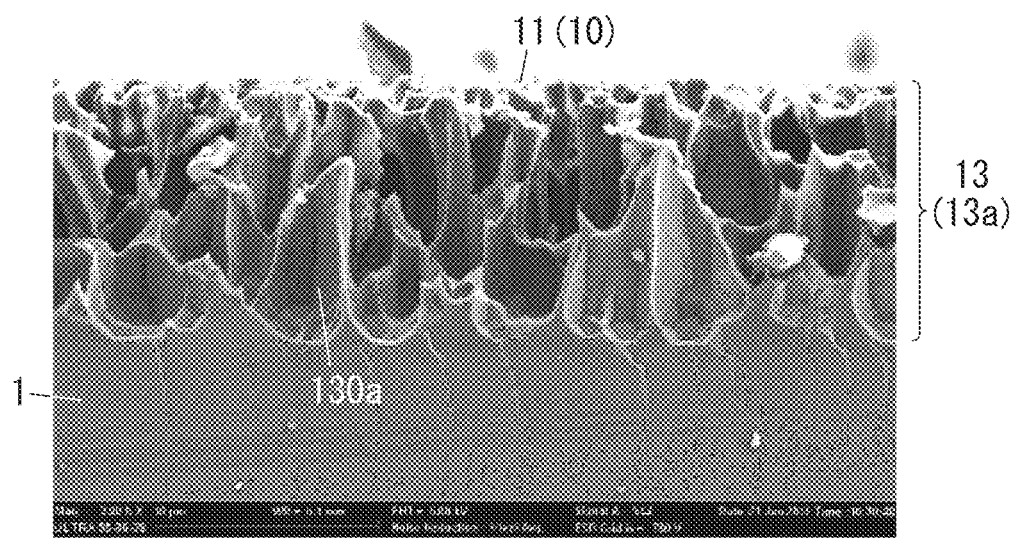
FIG. 9B is a photograph (magnification: 3000) obtained by capturing an image of the main part of the silicon substrate by the SEM after fine nanoporous part removal.

FIG. 9A is a photograph (corresponding to FIG. 7A) obtained by capturing, by using a SEM, an image of a main part of the silicon substrate 1 after the first anode oxidation process. This photograph clearly shows that the fine nanoporous parts 13c are in the macro pores 130a of the macroporous part 13a. FIG. 9B (corresponding to FIG. 7C) shows a photograph taken after the fine nanoporous parts 13c are removed from the interior of the macro pores 130a by using a TMAH aqueous solution as an etching solution.

Figure 7A:
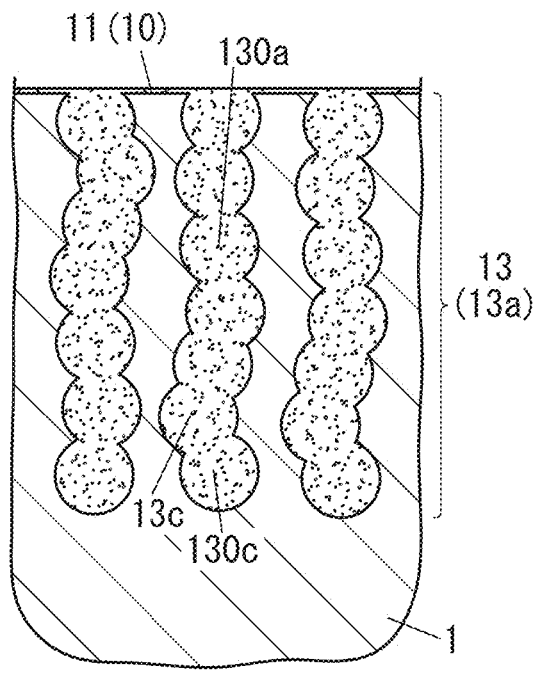
FIG. 7A is an enlarged view of a main part of a silicon substrate after a first anode oxidation process.
Figure 7B:
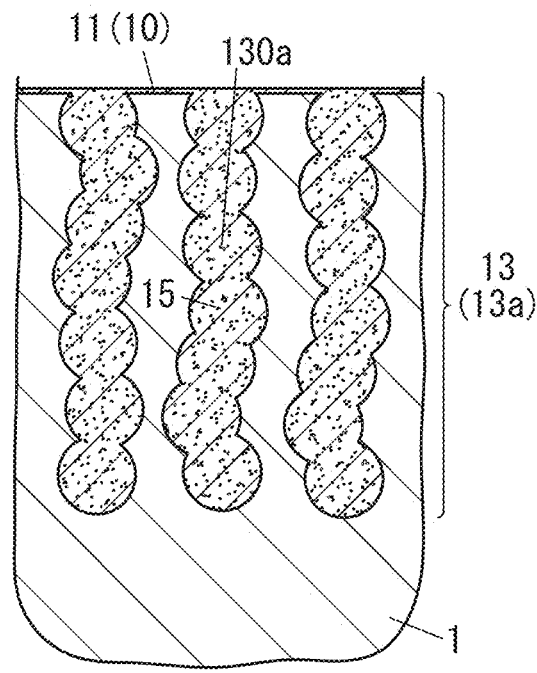
FIG. 7B is an enlarged view of the main part of the silicon substrate after a thermal oxidation process.
Figure 7C:
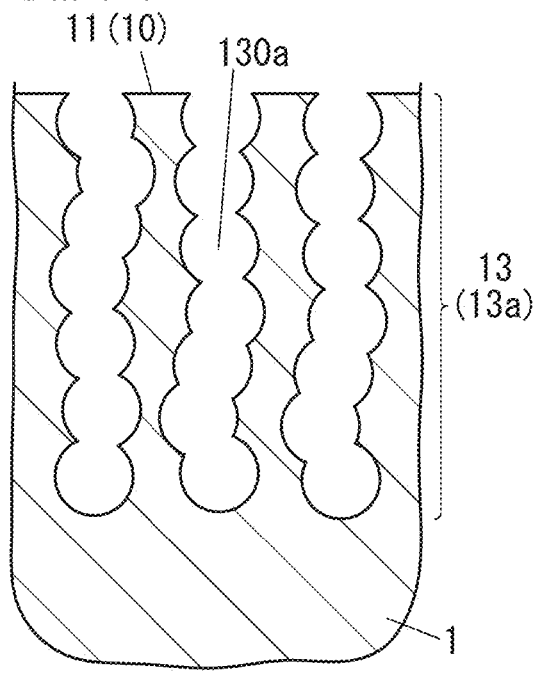
FIG. 7C is an enlarged view of the main part of the silicon substrate after oxidized products are removed.
Figure 7D:
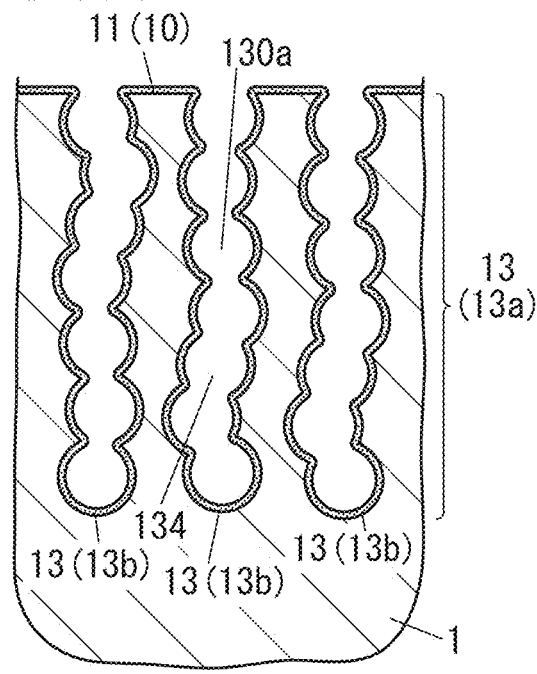
FIG. 7D is an enlarged view of the main part of the silicon substrate after second anode oxidation process.

In contrast, the second removable means is, as shown in FIGS. 7B and 7C, a means of removing the fine nanoporous parts 13c after the fine nanoporous parts 13c are made into the oxidized products 15. That is, the removal step includes a step of oxidizing the fine nanoporous parts 13c to obtain the oxidized products 15 (oxidation step) and a step of removing the oxidized products 15 by etching (oxidized product removing step).

In the oxidation step, the thermal oxidation process is performed. The condition of the thermal oxidation process is, for example, that the heating temperature is higher than or equal to 1000° C. and lower than or equal to 1200° C. in an oxygen atmosphere. A heating time is about 60 minutes.

As described above, the total surface area of the fine nanoporous parts 13c is greater than that of the macroporous part 13a. Thus, the total area of the fine nanoporous parts 13c which is in contact with oxygen is greater than the area of the macroporous part 13a which is in contact with oxygen, and thus, the fine nanoporous parts 13c are more easily oxidized. That is, oxygen enters the fine nano pores 130c of the fine nanoporous parts 13c and chemically changes the fine nanoporous parts 13c into the oxidized products 15 (specifically oxidation silicon). In contrast, the macroporous part 13a is hardly oxidized and remains as non-oxidized product (specifically silicon).

In the oxidized product removing step, an etching solution showing higher selectivity to the oxidized products 15 than to the non-oxidized product is used to selectively remove the oxidized products 15 by the etching solution (see FIG. 7C). The etching solution is not particularly limited, but examples of the etching solution include hydrofluoric acid. The hydrofluoric acid is an aqueous solution of hydrogen fluoride and is generally called hydrofluoric acid.

As described above, the second removal means includes making the fine nanoporous parts 13c into the oxidized products 15, thereby facilitating the removal of the fine nanoporous parts 13c from the interior of the macro pores 130a as shown in FIG. 7C.

Next, the nanoporous part forming step will be described. Performing the anode oxidation process for a second time (second anode oxidation process) forms the nanoporous part 13b in the inner surface of each of the macro pores 130a (see FIG. 7D). Conditions of the second anode oxidation process may be made different from conditions of the first anode oxidation process. Examples of conditions include, but are not limited to, a time period, a current density, and the like for performing the anode oxidation process. As described above, formation conditions of the fine nanoporous parts 13c are different from formation conditions of the nanoporous part 13b. Specifically, the conditions are set such that the nano pores 130b greater than the fine nano pores 130c and smaller than the macro pores 130a are formed. For example, a time period for the second anode oxidation process is made shorter than a time period for the first anode oxidation process. Thus, the hollow part 134 remains as shown in FIG. 7D, and therefore, the dielectric layer 3 and the conductor layer 2 easily enter the hollow part 134 (the macro pores 130a and the nano pores 130b).

The porous part 13 is then formed in the thickness direction defined with respect to the silicon substrate 1 in the capacitance generation region 11.

Figure 4C:
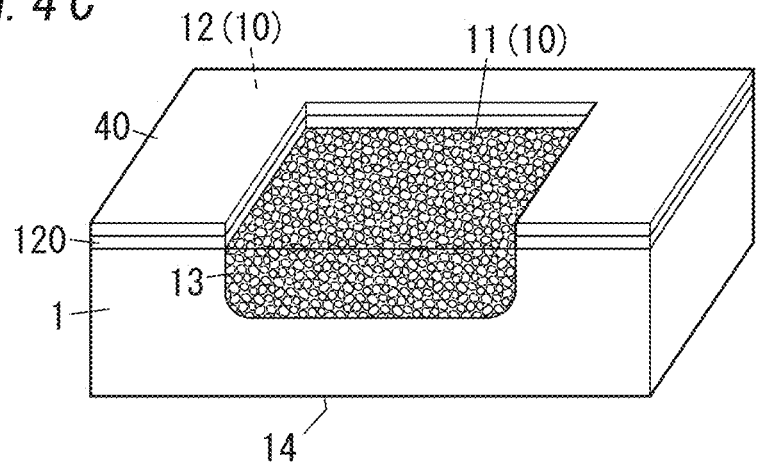
Figure 5:
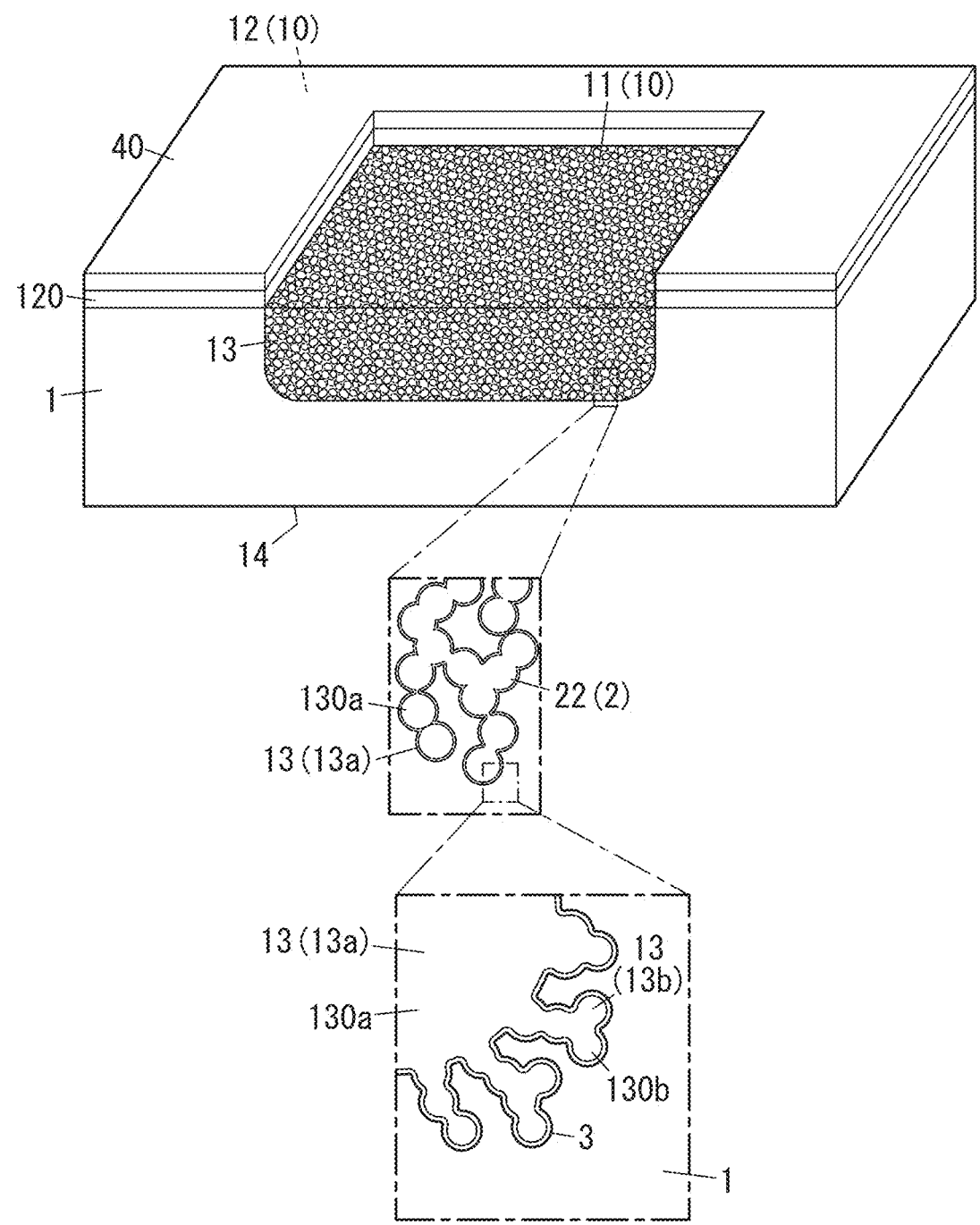
FIG. 5 is a schematic perspective view of the example of the method for producing the capacitor according to the embodiment of the present disclosure.

Next, as shown in FIG. 4C, the back surface electrode 141 provided on the second principal surface 14 is removed.

Increasing the surface area of the inner surface of the porous part 13 can increase the electrostatic capacitance of the capacitor 100, but the surface area of the inner surface of the porous part 13 is influenced by the diameter and the depth of each of the macro pores 130a and the nano pores 130b. The diameter and depth may be controlled by, for example, (a) to (c) indicated below.

(a) The electric conductivity of the silicon substrate 1, that is, the amount of impurity contained in the silicon substrate 1.
(b) The concentration of hydrofluoric acid in the mixed liquid.
(c) Current density ($A/cm^2$) represented by the value of a current which flows between the back surface electrode 141 and the mixed liquid to the area of the capacitance generation region 11.

For example, in the present embodiment, the concentration of the hydrofluoric acid in a mixer is preferably greater than or equal to 1 weight % and less than or equal to 80 weight %, preferably greater than or equal to 20 weight % and less than or equal to 40 weight %. In this case, the masking layer 40 can be suppressed from being deteriorated and changed in property due to the hydrofluoric acid, and the average value of diameters of the macro pores 130a can be adjusted to be within the range from 100 nm to 5 μm inclusive.

Moreover, when the silicon substrate 1 is subjected to the anode oxidation process, electric fields tend to concentrate on a portion corresponding to the corner 133 of the porous part 13. Thus, as shown in FIG. 2, the corner 133 of the porous part 13 extends from the portion underlying the capacitance generation region 11 of the silicon substrate 1 in the thickness direction into the portion underlying the non-capacitance generation region 12 of the silicon substrate 1 in the thickness direction.

Moreover, when the silicon substrate 1 is an n-type semiconductor, the silicon substrate 1 is preferably irradiated with light and is then subjected to the anode oxidation process. Specifically, the silicon substrate 1 is preferably irradiated with light before the silicon substrate 1 is subjected to the thermal oxidation process.

Preferably, after the silicon substrate 1 is made porous and before the dielectric layer forming step, impurity diffusion is performed to form a high-concentration region of an impurity on the inner surface of the porous part 13. Examples of an impurity diffusion method include heat diffusion. Examples of the impurity include phosphorus (P) and boron (B). As described above, forming the high-concentration region of the impurity on the inner surface of the porous part 13 can reduce the equivalent series resistance (ESR) of the capacitor 100. Moreover, making a depletion layer (an electrically insulated region) less likely to be formed can suppress the electrostatic capacitance of the capacitor 100 from being reduced.

<Dielectric Layer Forming Step>

The dielectric layer forming step includes forming the dielectric layer 3 on the inner surface of the porous part 13 (see FIG. 8). Specifically, the silicon substrate 1, in which the porous part 13 has been formed in the porous part forming step described above, is subjected to the thermal oxidation process. This oxidizes the inner surface of the porous part 13. Since the porous part 13 is part of the silicon substrate 1, oxidizing the inner surfaces of the macro pores 130a and the nano pores 130b forms a coating made of oxidized silicon, thereby providing the dielectric layer 3 (see FIG. 5). Moreover, the thermal oxidation process has to be performed such that the dielectric layer 3 can secure the insulation property of the inner surfaces of at least the macro pores 130a and the nano pores 130b. The condition of the thermal oxidation process is preferably, for example, that the heating temperature is higher than or equal to 800° C. and lower than or equal to 1200° C. in an oxygen atmosphere. Moreover, silicon nitride formed by chemical vapor deposition (CVD) may further be used as a dielectric.

As described above, removing the fine nanoporous parts 13c from the interior of the macro pores 130a facilitates formation of the nanoporous part 13b in the inner surface of each of the macro pores 130a as shown in FIG. 7D. In addition, as shown in FIG. 8, the dielectric layer 3 is easily formed in the nano pores 130b of the nanoporous part 13b. In FIG. 8, the dielectric layer 3 is shown as an ONO film (a first silicon oxide film 31/a nitride film 33/a second silicon oxide film 32) but is not limited to this example.

Then, as shown in FIG. 8, the hollow part 134 still remains even after the dielectric layer 3 is formed on the inner surfaces of the macro pores 130a and the nano pores 130b, and therefore, the hollow part 134 is easily filled with the filling part 22. The filling part 22 has a conductive property. Thus, the surface areas of electrodes facing each other can be increased, and thus, the electrostatic capacitance of the capacitor 100 can be increased.

<Conductor Layer Forming Step>

The conductor layer forming step includes forming the conductor layer 2 including the filling part 22 filled in at least part of (in the present embodiment, in the entirety of) the macro pores 130a and the nano pores 130b and the surface layer part 21 at least covering part of the surface 110 of the capacitance generation region 11. Specifically, the conductor layer 2 is formed by the following method.

Figure 6A:
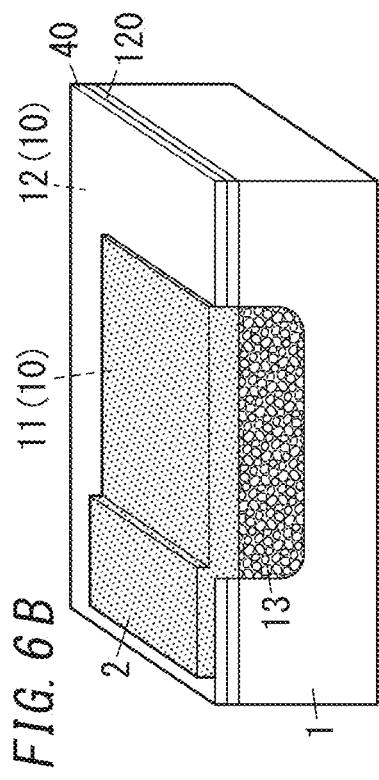
FIGS. 6A to 6E are schematic perspective views of the example of the method for producing the capacitor according to the embodiment of the present disclosure.

First of all, as shown in FIG. 6A, the conductor layer 2 is formed on the entirety of the first principal surface 10 of the silicon substrate 1. That is, the conductor layer 2 is formed to cover the capacitance generation region 11 and the non-capacitance generation region 12. The conductor layer 2 includes at least one kind of element selected from the group consisting of polysilicon, platinum, and ruthenium. For example, when the conductor layer 2 includes polysilicon, the conductor layer 2 may be formed by chemical vapor deposition (CVD). When the conductor layer 2 made of polysilicon is formed by CVD, at least part of the porous part 13 is filled with the polysilicon. A layer made of the polysilicon filled in the porous part 13 serves as the filling part 22 of the conductor layer 2. Moreover, a layer made of the polysilicon is formed also on the surface 110 of the capacitance generation region 11. The layer made of the polysilicon formed on the surface 110 serves as the surface layer part 21 of the conductor layer 2. Moreover, forming the conductor layer 2 on the entirety of the first principal surface 10 forms a layer made of the polysilicon also on the non-capacitance generation region 12. A temperature at the time of forming the conductor layer 2 made of the polysilicon by CVD is not particularly limited but is preferably, for example, higher than or equal to 400° C. and lower than or equal to 900° C.

Figure 6B:
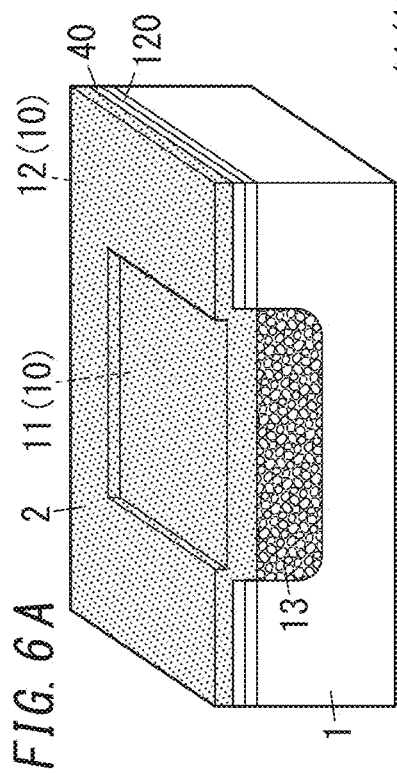

Then, part of a portion which is included in the conductor layer 2 formed on the entirety of the first principal surface 10 and which overlaps the non-capacitance generation region 12 is removed as illustrated in FIG. 6B. This exposes the masking layer 40 provided on the non-capacitance generation region 12. Moreover, in the present embodiment, part of the conductor layer 2 is left on the non-capacitance generation region 12. Thus, at a portion of the non-capacitance generation region 12 on which the conductor layer 2 is left, the masking layer 40 is not exposed, and the oxidized coating 120, the masking layer 40, and the conductor layer 2 are stacked in this order. A method for removing the conductor layer 2 is not particularly limited but may use, for example, a semiconductor laser.

Figure 6C:
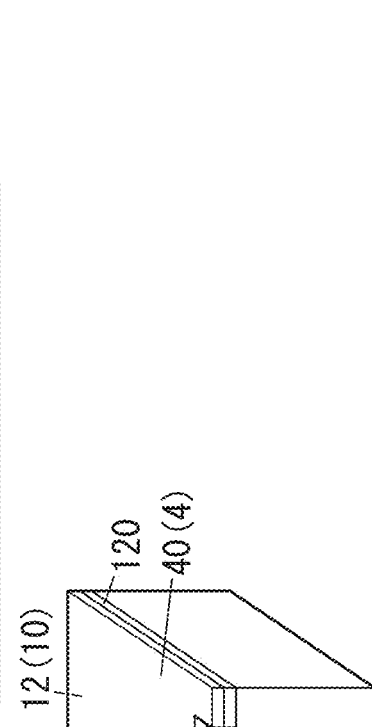

Next, as shown in FIG. 6C, the oxidized coating 120 and the masking layer 40 exposed in the non-capacitance generation region 12 are partially removed. This can expose the silicon substrate 1 in the non-capacitance generation region 12. Moreover, the insulation property of a portion of the non-capacitance generation region 12 can be secured, the portion being covered with the masking layer 40 and the oxidized coating 120. Moreover, the masking layer 40 provided on the non-capacitance generation region 12 serves as the inorganic insulating layer 4 included in the capacitor 100 shown in FIG. 1. Thus, as in the present embodiment, the inorganic insulating layer 4 including silicon nitride is obtained when the masking layer 40 is made of silicon nitride.

Figure 6D:
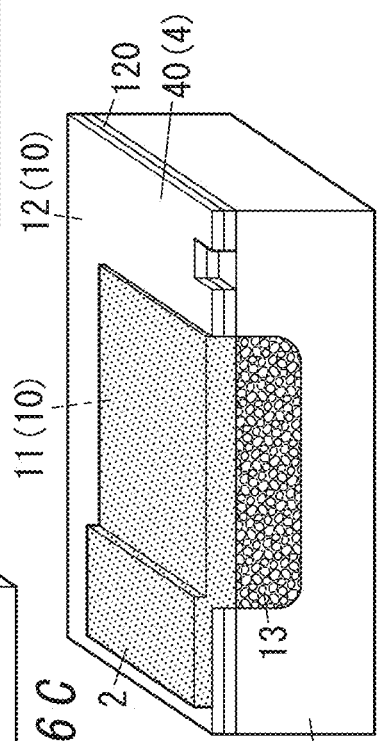
Figure 6E:
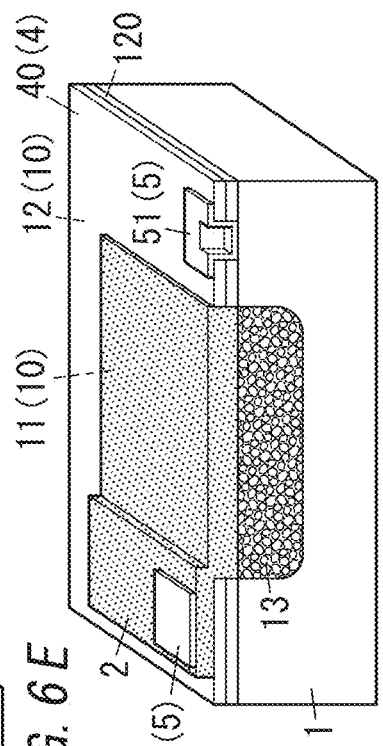

Next, as shown in FIG. 6D, the entirety of the first principal surface 10 is covered with a layer 50 made of metal used as a material for the contact terminals 5. Then, the layer 50 is removed such that part of the layer 50 is left as shown in FIG. 6E, thereby forming the first contact terminal 51 and the second contact terminal 52. Specifically, of the layer 50 made of the metal, a portion located on an exposed portion of the silicon substrate 1 and its peripheral part on the non-capacitance generation region 12 are left, thereby producing the first contact terminal 51. Moreover, of the layer 50 made of the metal, a portion located on the conductor layer 2 provided above the non-capacitance generation region 12 is left, thereby producing the second contact terminal 52.

The steps described above produce the capacitor 100 shown in FIG. 1.

2. Variation

Figure 10:
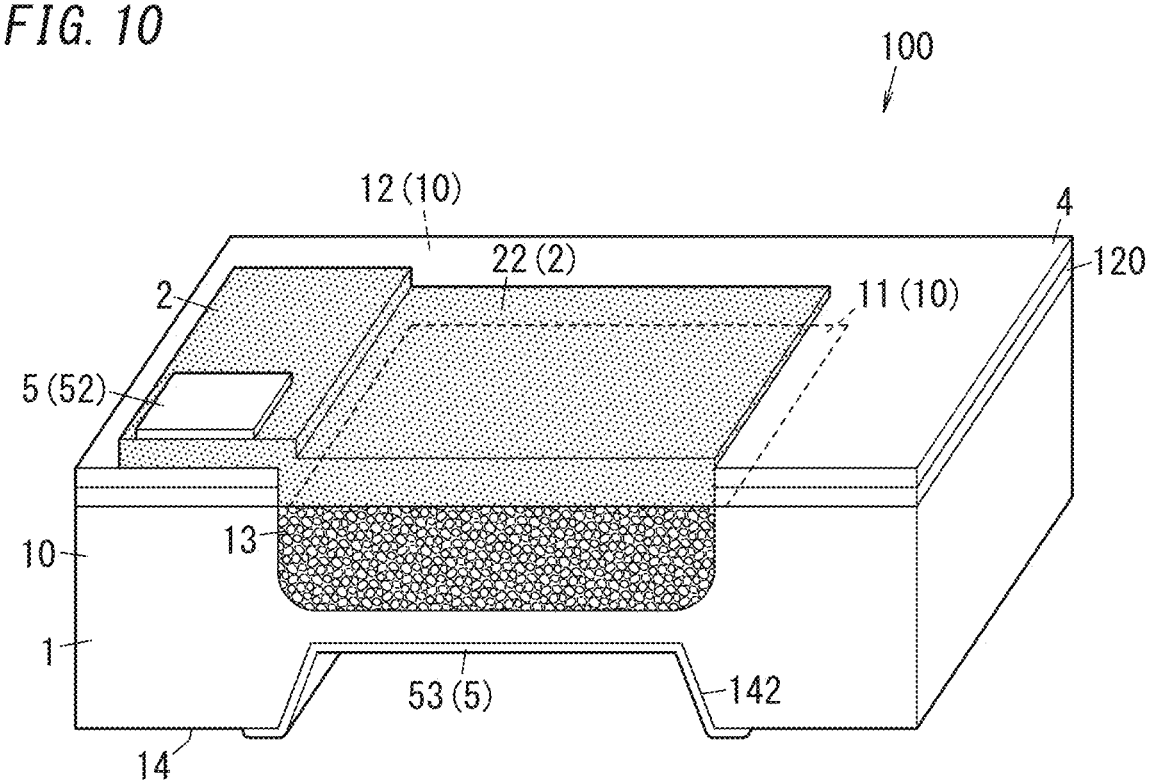
FIG. 10 is a schematic perspective view of a variation of the capacitor of FIG. 1.

In the capacitor 100 shown in FIG. 1, a through hole is formed in the inorganic insulating layer 4 on the non-capacitance generation region 12, and the silicon substrate 1 exposed in the through hole and the first contact terminal 51 are electrically connected to each other, but this should not be construed as limiting. For example, as shown in FIG. 10, the silicon substrate 1 has a second principal surface 14 located on an opposite side from the first principal surface 10, the second principal surface 14 has a region underlying the capacitance generation region 11 in the thickness direction defined with respect to the silicon substrate 1, and the region has a cavity 142 depressed toward the first principal surface 10. A contact terminal 5 made of metal (a third contact terminal 53) in place of the first contact terminal 51 is formed on a surface of the cavity 142, and thereby, the distance between a first electrode (the third contact terminal 53) and a second electrode (a second contact terminal 52) can be shorter than that of the capacitor 100 shown in FIG. 1.

For example, in the capacitor 100 shown in FIG. 1, the inorganic insulating layer 4 including silicon nitride is provided on the non-capacitance generation region 12, and between the conductor layer 2 above the non-capacitance generation region 12 and the silicon substrate 1, the inorganic insulating layer 4 is provided, but this should not be construed as limiting. For example, the capacitor 100 does not have to include the inorganic insulating layer 4. For example, to produce the capacitor 100, metal (e.g., chrome and gold) or an organic resin is preferably used as the masking layer 40, and the masking layer 40 is preferably removed after the anode oxidation process (after the porous part 13 is formed) and before the conductor layer 2 is formed. The linear expansivity difference of the metal (e.g., chrome and gold) and the organic resin from the silicon substrate 1 is greater than the linear expansivity difference of silicon nitride from the silicon substrate 1. Therefore, when the masking layer 40 made of metal (e.g., chrome and gold) or an organic resin is not included in the capacitor 100, the occurrence of a warp due to the linear expansivity difference between the masking layer 40 and the silicon substrate 1 can be suppressed.

3. Aspects

As can be seen from the embodiment and variations described above, the present disclosure includes the following aspects. In the following description, reference signs in parentheses are added only to clarify the correspondence relationship to the embodiment.

A first aspect is a capacitor (100) including a silicon substrate (1), a conductor layer (2), and a dielectric layer (3). The silicon substrate (1) has a principal surface (10) including a capacitance generation region (11) and a non-capacitance generation region (12). The silicon substrate (1) includes a porous part (13) provided in a thickness direction in the capacitance generation region (11). The conductor layer (2) includes a surface layer part (21) at least covering part of a surface (110) of the capacitance generation region (11) and a filling part (22) filled in at least part of the porous part (13). The dielectric layer (3) is provided between an inner surface of the porous part (13) and the filling part (22). The porous part (13) includes a macroporous part (13a) having macro pores (130a) and a nanoporous part (13b) formed in at least part of inner surfaces of the macro pores (130a) and having nano pores (130b) smaller than the macro pores (130a).

With this aspect, the porous part (13) provided in the thickness direction in the capacitance generation region (11) in the principal surface (10) of the silicon substrate (1) and the filling part (22) filled in the porous part (13) easily secure surface areas of electrodes, thereby increasing the electrostatic capacitance of the capacitor (100). Moreover, the porous part (13) is formed in the capacitance generation region (11), and therefore, the strength of the silicon substrate (1) is suppressed from being reduced as compared to the case where the entirety of the principal surface (10) is made porous.

A second aspect is a capacitor (100) based on the first aspect. In the second aspect, the dielectric layer (3) is extended into the nano pores (130b).

With this aspect, the electrostatic capacitance of the capacitor (100) is further increased.

A third aspect is a capacitor (100) based on the first or second aspect. In the third aspect, the conductor layer (2) is extended into the nano pores (130b).

With this aspect, the electrostatic capacitance of the capacitor (100) is further increased.

The fourth aspect is a capacitor (100) based on any one of the first to third aspects. In the fourth aspect, the nanoporous part (13b) is on an entirety of the inner surfaces of the macro pores (130a).

With this aspect, the electrostatic capacitance of the capacitor (100) is further increased.

The fifth aspect is a capacitor (100) based on any one of the first to third aspects. In the fifth aspect, the nanoporous part (13b) is only on part of the inner surfaces of the macro pores (130a).

With this aspect, the electrostatic capacitance of the capacitor (100) is further increased.

The sixth aspect is a capacitor (100) based on any one of the first to fifth aspects. In the sixth aspect, the macro pores (130a) extend from a plurality of locations in the capacitance generation region (11) along one direction transverse to the principal surface (10).

With this aspect, the electrostatic capacitance of the capacitor (100) is further increased.

The seventh aspect is a capacitor (100) based on any one of the first to sixth aspects. In the seventh aspect, the nano pores (130b) are a plurality of fine pores continuous from the inner surfaces of the macro pores (130a).

With this aspect, the electrostatic capacitance of the capacitor (100) is further increased.

The eighth aspect is a capacitor (100) based on any one of the first to seventh aspects. In the eighth aspect, at least the macro pores (130a) or the nano pores (130b) are branched.

With this aspect, the electrostatic capacitance of the capacitor (100) is further increased.

The ninth aspect is a capacitor (100) based on any one of the first to eighth aspects. In the ninth aspect, an average value of pore diameters of the nano pores (130b) is greater than or equal to 30 nm and less than or equal to 500 nm.

With this aspect, the electrostatic capacitance of the capacitor (100) is further increased.

A tenth aspect is a method for producing a capacitor (100) and includes providing a masking layer (40) on a non-capacitance generation region (12) of a silicon substrate (1) having a principal surface (10) including a capacitance generation region (11) and the non-capacitance generation region (12); forming, by an anode oxidation process, a macroporous part (13a) in the capacitance generation region (11) in a thickness direction defined with respect to the silicon substrate (1) by forming macro pores (130a) in the capacitance generation region (11) which is not covered with the masking layer (40); forming a nanoporous part (13b) in inner surfaces of the macro pores (130a) of the macroporous part (13a), the nanoporous part (13b) having nano pores (130b) smaller than the macro pores (130a); forming a dielectric layer (3) on the inner surfaces of the macro pores (130a) and inner surfaces of the nano pores (130b); and forming a conductor layer (2) including a filling part (22) filled in at least part of the macro pores (130a) and the nano pores (130b) and a surface layer part (21) at least covering part of a surface (110) of the capacitance generation region (11).

With this aspect, the electrostatic capacitance of the capacitor (100) is further increased.

An eleventh aspect is a method for producing the capacitor (100) based on the tenth aspect. The eleventh aspect further includes, after forming fine nanoporous parts (13c) in the macro pores (130a), removing at least part of the fine nanoporous parts (13c), the fine nanoporous parts (13c) having fine nano pores (130c) smaller than the nano pores (130b).

With this aspect, the electrostatic capacitance of the capacitor (100) is further increased.

A twelfth aspect is a method for producing the capacitor (100) based on the eleventh aspect. In the twelfth aspect, the removal step includes oxidizing the fine nanoporous parts (13c) to obtain oxidized products (15) and removing the oxidized products (15) by etching.

With this aspect, the electrostatic capacitance of the capacitor (100) is further increased.

A thirteenth aspect is a method for producing the capacitor (100) based on the eleventh or twelfth aspect. In the thirteenth aspect, the fine nanoporous parts (13c) are formed under a condition different from a condition under which the nanoporous part (13b) is formed.

With this aspect, the electrostatic capacitance of the capacitor (100) is further increased.

The invention claimed is:

1. A capacitor comprising:
   a silicon substrate having a principal surface including a capacitance generation region and a non-capacitance generation region, the silicon substrate including a porous part provided in a thickness direction in the capacitance generation region;
   a conductor layer including:
      a surface layer part at least covering part of a surface of the capacitance generation region and
      a filling part filled in at least part of the porous part; and
   a dielectric layer provided between an inner surface of the porous part and the filling part,
   the porous part including:
      a macroporous part having macro pores, and
      a nanoporous part formed in at least part of inner surfaces of the macro pores and having nano pores smaller than the macro pores,
   the nanoporous part being on an entirety of the inner surfaces of the macro pores.

2. The capacitor of claim 1, wherein the dielectric layer is extended into the nano pores.

3. The capacitor of claim 1, wherein the conductor layer is extended into the nano pores.

4. The capacitor of claim 1, wherein the macro pores extend from a plurality of locations in the capacitance generation region along one direction transverse to the principal surface.

5. The capacitor of claim 1, wherein the nano pores are a plurality of fine pores continuous from the inner surfaces of the macro pores.

6. The capacitor of claim 1, wherein at least the macro pores or the nano pores are branched.

7. The capacitor of claim 1, wherein an average value of pore diameters of the nano pores is greater than or equal to 30 nm and less than or equal to 500 nm.

8. A method for producing a capacitor, the method comprising:
   providing a masking layer on a non-capacitance generation region of a silicon substrate having a principal surface including a capacitance generation region and the non-capacitance generation region;
   forming, by an anode oxidation process, a macroporous part in the capacitance generation region in a thickness direction defined with respect to the silicon substrate by forming macro pores in the capacitance generation region which is not covered with the masking layer;
   forming a nanoporous part in inner surfaces of the macro pores of the macroporous part, the nanoporous part having nano pores smaller than the macro pores;

forming a dielectric layer on the inner surfaces of the macro pores and inner surfaces of the nano pores;

forming a conductor layer including a filling part filled in at least part of the macro pores and the nano pores and a surface layer part at least covering part of a surface of the capacitance generation region; and after forming fine nanoporous parts in the macro pores, removing at least part of the fine nanoporous parts, the fine nanoporous parts having fine nano pores smaller than the nano pores.

9. The method of claim 8, wherein the removal step includes oxidizing the fine nanoporous parts to obtain oxidized products and removing the oxidized products by etching.

10. The method of claim 8, wherein the fine nanoporous parts are formed under a condition different from a condition under which the nanoporous part is formed.

11. A capacitor comprising:
a silicon substrate having a principal surface including a capacitance generation region and a non-capacitance generation region, the silicon substrate including a porous part provided in a thickness direction in the capacitance generation region;
a conductor layer including:
    a surface layer part at least covering part of a surface of the capacitance generation region and
    a filling part filled in at least part of the porous part; and
a dielectric layer provided between an inner surface of the porous part and the filling part,
the porous part including:
    a macroporous part having macro pores, and
    a nanoporous part formed in at least part of inner surfaces of the macro pores and having nano pores smaller than the macro pores,
the nano pores being a plurality of fine pores continuous from the inner surfaces of the macro pores.

* * * * *